United States Patent
Lee et al.

(10) Patent No.: US 12,249,620 B2
(45) Date of Patent: Mar. 11, 2025

(54) POWER SEMICONDUCTOR DEVICE AND METHOD FOR FABRICATING THE SAME

(71) Applicants: HYUNDAI MOTOR COMPANY, Seoul (KR); KIA CORPORATION, Seoul (KR)

(72) Inventors: Jong Seok Lee, Suwon-si (KR); Tae Ho Jeong, Yongin-si (KR); Kyoung Kook Hong, Hwaseong-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 470 days.

(21) Appl. No.: 17/707,706

(22) Filed: Mar. 29, 2022

(65) Prior Publication Data
US 2023/0061126 A1    Mar. 2, 2023

(30) Foreign Application Priority Data

Aug. 30, 2021    (KR) .......................... 10-2021-0115073

(51) Int. Cl.
*H01L 29/06*    (2006.01)
*H01L 21/8234*    (2006.01)
(Continued)

(52) U.S. Cl.
CPC .. *H01L 29/0607* (2013.01); *H01L 21/823412* (2013.01); *H01L 29/0696* (2013.01);
(Continued)

(58) Field of Classification Search
CPC ......... H01L 21/823412; H01L 29/0607; H01L 29/0696; H01L 29/4236; H01L 29/4238; H01L 29/66734; H01L 29/7813
(Continued)

(56) References Cited

U.S. PATENT DOCUMENTS 6,852,597 B2    2/2005    Park et al.
7,951,676 B2    5/2011    Schmidt
(Continued)

FOREIGN PATENT DOCUMENTS

JP    5472862 B2    2/2014
KR    100400079 B1    9/2003
(Continued)

OTHER PUBLICATIONS

Dong-Hyeon Kim et al., Effect of P-Emitter Length and Structure on Asymmetric SiC MOSFET Performance, J. Korean Inst. Electr. Electron. Mater. Eng.; Mar. 2020; 5 pp.

*Primary Examiner* — Igwe U Anya
(74) *Attorney, Agent, or Firm* — Lempia Summerfield Katz LLC

(57) ABSTRACT

A power semiconductor device includes: a semiconductor layer; a well region positioned inside the semiconductor layer and having a first conductive type; a source region positioned on the well region and having a second conductive type; a gate region making contact with a side surface of the well region to surround the well region; and a drift region making contact with bottom surfaces of the well region and the gate region and having the second conductive type. The drift region may include a protrusion region extending from the drift region and making contact with another side surface of the well region.

16 Claims, 14 Drawing Sheets

(51) Int. Cl.
  *H01L 29/423* (2006.01)
  *H01L 29/66* (2006.01)
  *H01L 29/78* (2006.01)

(52) U.S. Cl.
  CPC ...... *H01L 29/4236* (2013.01); *H01L 29/4238* (2013.01); *H01L 29/66734* (2013.01); *H01L 29/7813* (2013.01)

(58) Field of Classification Search
  USPC ....................................................... 257/420
  See application file for complete search history.

(56) References Cited

U.S. PATENT DOCUMENTS

| | | |
|---|---|---|
| 8,124,533 B2 | 2/2012 | Narazaki |
| 9,373,692 B2 | 6/2016 | Hirler et al. |
| 9,859,400 B2 | 1/2018 | Darwish et al. |
| 10,480,327 B2 * | 11/2019 | Rathay .................... F01D 5/187 |
| 2003/0068864 A1 | 4/2003 | Il-yong et al. |
| 2010/0240183 A1 | 9/2010 | Narazaki |
| 2018/0308938 A1 | 10/2018 | Siemieniec et al. |
| 2019/0109218 A1 * | 4/2019 | Corvasce ............ H01L 29/0619 |
| 2019/0181229 A1 * | 6/2019 | Okumura ............ H01L 29/7806 |
| 2022/0406937 A1 * | 12/2022 | Karner ................ H01L 29/7843 |

FOREIGN PATENT DOCUMENTS

| | | |
|---|---|---|
| KR | 100555444 B1 | 3/2006 |
| KR | 20180087535 A | 8/2018 |

* cited by examiner

POWER SEMICONDUCTOR DEVICE AND METHOD FOR FABRICATING THE SAME

CROSS-REFERENCE TO RELATED APPLICATION

This application claims the benefit of priority to Korean Patent Application No. 10-2021-0115073, filed in the Korean Intellectual Property Office on Aug. 30, 2021, the entire contents of which are incorporated herein by reference.

TECHNICAL FIELD

The present disclosure relates to a power semiconductor device.

BACKGROUND

A power semiconductor device, which is a semiconductor device to control a high voltage or a high current, may function as an electrical switch. The power semiconductor device may have higher resistance against heat or stress to process a high voltage and a high current. In addition, the power semiconductor device may exhibit lower power consumption to function as the switch and a higher breakdown voltage which is the maximum voltage to maintain a switch-off state.

A power metal oxide semiconductor (MOS) field effect transistor, which is a kind of a power semiconductor, may have characteristics such as low power consumption, high efficiency, a small size, high reliability, high-speed reliability, and low noise.

SUMMARY

The present disclosure has been made to solve the above-mentioned problems occurring in the prior art while maintaining advantages achieved by the prior art are maintained intact.

An aspect of the present disclosure provides a power semiconductor device including silicon carbide (SiC), capable of mitigating the concentration of an electric field at a lower portion of a gate region, increasing a channel density, and reducing a switching loss. Another aspect of the present disclosure provides a method for fabricating the same.

The technical problems to be solved by the present disclosure are not limited to the aforementioned problems. Any other technical problems not mentioned herein should be clearly understood from the following description by those having ordinary skill in the art to which the present disclosure pertains.

According to an embodiment of the present disclosure, a power semiconductor device may include: a semiconductor layer; a well region positioned inside the semiconductor layer and having a first conductive type; a source region positioned on the well region and having a second conductive type; a gate region making contact with a side surface of the well region to surround the well region; and a drift region making contact with bottom surfaces of the well region and the gate region and having the second conductive type. The drift region may include a protrusion region extending from the drift region and making contact with another side surface of the well region.

In addition, according to an embodiment of the present disclosure, the power semiconductor device may further include a first channel region and a second channel region positioned in contact regions between the gate region and the well region. The first channel region may include a horizontal channel extending from the source region to the protrusion region. The second channel region may include a vertical channel extending along a side surface of the gate region from the source region.

In addition, according to an embodiment, a doping concentration of the source region may be higher than a doping concentration of the drift region.

In addition, according to an embodiment, the power semiconductor device may further include a contact region positioned on the well region and having the first conductive type. The doping concentration of the contact region may be higher than the doping concentration of the well region.

In addition, according to an embodiment, the power semiconductor device may include a contact region positioned on the well region and having the first conductive type and may include a source electrode making contact with the source region and the contact region.

In addition, according to an embodiment, the power semiconductor device may further include a substrate region positioned under the drift region and having the second conductive type. The power semiconductor device may also include a drain electrode positioned under the substrate region and making contact with the substrate region. The doping concentration of the substrate region may be higher than the doping concentration of the drift region.

In addition, according to an embodiment, the gate region may make contact with the well region on at least three surfaces.

In addition, according to an embodiment, the well region may have a circular sectional surface.

In addition, according to an embodiment, the well region may have a polygonal sectional surface having at least three sides.

In addition, according to an embodiment, the well region may be positioned at a first depth from one surface of the semiconductor layer. The gate region may be positioned at a second depth from the one surface of the semiconductor layer. The first depth may be deeper than the second depth. The well region may include an extension region extending along a bottom surface of the gate region.

According to another embodiment of the present disclosure, a method for fabricating a power semiconductor device may include: forming a drift region in a second conductive type on a semiconductor layer; forming a well region in a first conductive type at a first depth from one surface of the semiconductor layer; forming a source region in the second conductive type on the well region; forming a contact region in the first conductive type on the well region; and forming a gate region by recessing the semiconductor layer and the well region by a second depth to make contact with a side surface of the well region and to surround the well region. The drift region may include a protrusion region extending from the drift region and making contact with another side surface of the well region.

In addition, according to another embodiment of the present disclosure, the first depth may be greater than the second depth.

In addition, according to another embodiment of the present disclosure, the gate region may be formed to make contact with the well region on at least three surfaces.

In addition, according to another embodiment of the present disclosure, the contact region may be doped at a doping concentration higher than a doping concentration of the well region.

In addition, according to another embodiment of the present disclosure, the source region may be doped at a doping concentration higher than a doping concentration of the drift region.

In addition, according to another embodiment of the present disclosure, the method for fabricating the power semiconductor device may further include forming a first channel region and a second channel region positioned in contact regions between the gate region and the well region. The first channel region may include a horizontal channel extending from the source region to the protrusion region. The second channel region may include a vertical channel extending along a side surface of the gate region from the source region.

In addition, according to another embodiment of the present disclosure, the method for fabricating the power semiconductor device may further include forming a source electrode making contact with the source region and the contact region.

BRIEF DESCRIPTION OF THE DRAWINGS

The above and other objects, features, and advantages of the present disclosure should be more apparent from the following detailed description taken in conjunction with the accompanying drawings.

DETAILED DESCRIPTION

Figure 1:
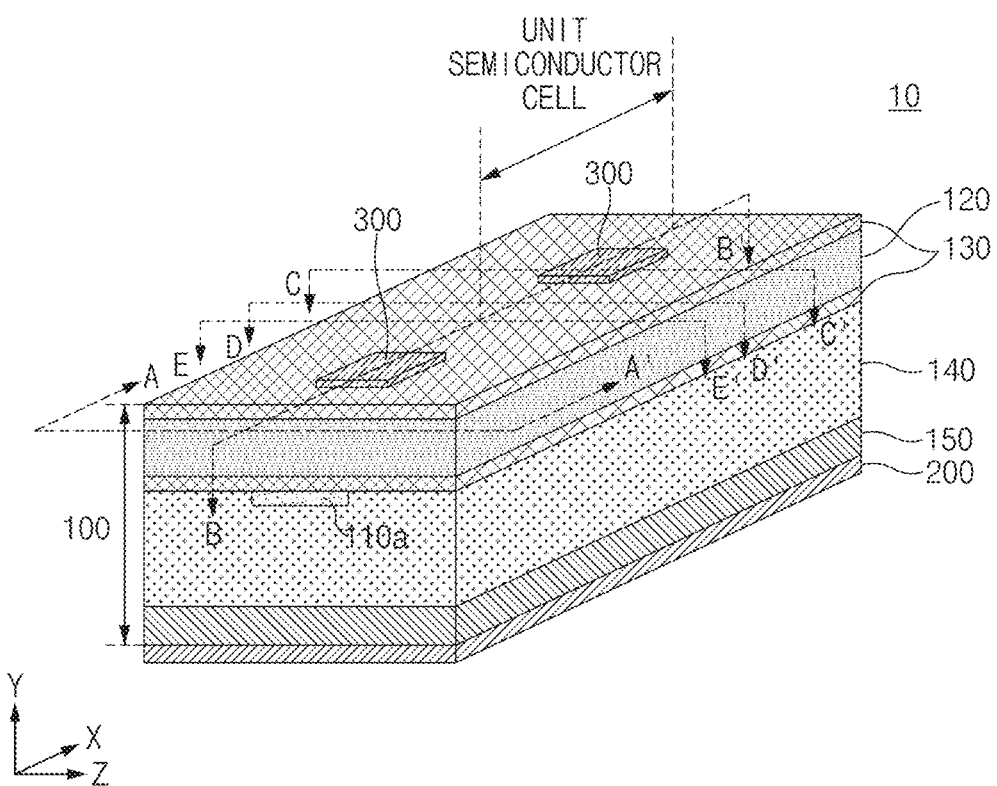
FIG. 1 is a perspective view schematically illustrating a power semiconductor device, according to an embodiment of the present disclosure.

Hereinafter, various embodiments are described with reference to accompanying drawings. However, those of ordinary skill in the art should understand that the present disclosure is not limited to a specific embodiment, and that modifications, equivalents, and/or alternatives to the various embodiments described herein can be variously made without departing from the scope and spirit of the disclosure. An embodiment of the present disclosure may provide various effects directly or indirectly recognized through the present disclosure.

The following embodiments are provided as examples so that the present disclosure will be thorough and complete and will fully convey the concept of the present disclosure to those having ordinary skill in the art. For the convenience of explanation, some components in the accompanying drawings may be exaggerated or reduced in size. The same reference numerals are assigned to the same components in drawings.

Unless otherwise defined, all terms used herein including technical or scientific terms have the same meanings as those generally understood by those having ordinary skill in the art to which the inventive concept pertains. In the accompanying drawings, the sizes of a layer and a region may be exaggerated for convenience of explanation for general structures in the present disclosure.

FIG. 1 is a perspective view schematically illustrating a power semiconductor device 10, according to an embodiment of the present disclosure.

Referring to FIG. 1, a power semiconductor device 10 may have a power metal oxide semiconductor field effect transistor (MOSFET) structure including a semiconductor layer 100, a drain electrode 200, and a source electrode 300. A gate electrode may be formed inside the semiconductor layer 100. A gate region 120 may be isolated from other regions (e.g., a drift region 140) by an insulating layer 130.

The semiconductor layer 100 may refer to a single semiconductor material layer or a plurality of semiconductor material layers. For example, the semiconductor layer 100 may include a substrate layer doped with silicon carbide (SiC) or an epitaxial layer. The substrate layer or the epitaxial layer may be formed in a multi-layer structure.

Silicon carbide (SiC) may have a bandgap wider than a bandgap of silicon (Si). Accordingly, silicon carbide (SiC) may maintain stability even at a higher temperature, as compared to silicon (Si). Further, silicon carbide (SiC) exhibits a remarkably high electric field for electrical breakdown, as compared to silicon (Si). Accordingly, silicon carbide (SiC) may stably work even at a higher voltage than silicon (Si). Accordingly, the power semiconductor device 10 employing silicon carbide (SiC) for the semiconductor layer 100 exhibits a higher breakdown voltage, an excellent heat emission characteristic, or a stable operating characteristic even at the higher temperature, as compared to the case of employing silicon (Si).

The drain electrode 200 may be formed under the semiconductor layer 100. The source electrode 300 may be formed on the semiconductor layer 100. The drain electrode 200 and the source electrode 300 may include a conductor and the conductor may include, for example, polysilicon or metal. A plurality of source electrodes 300 may be repeatedly formed for each unit semiconductor cell and may be connected with each other through a metal layer (not illustrated).

A plurality of unit semiconductor cells may be repeatedly arranged in an X-axis direction. The set of unit semiconductor cells may be the power semiconductor device 10.

The semiconductor layer 100 may include an extension region 110a, a gate region 120, the insulating layer 130, the drift region 140, and a substrate region 150. The extension region 110a may be a portion of a well region included in the semiconductor layer 100. The structure of the well region is described in detail with reference to FIG. 2

The extension region 110a may be doped with first conductive type impurities. The first conductive type may be different from the conductive type of the drift region 140. For example, the extension region 110a may be a region doped with P-type impurities.

The well region and the extension region 110a included in the well region may be positioned at an inner region of the semiconductor layer 100, which is recessed by a first depth from one surface of the semiconductor layer 100.

The extension region 110a may be a region extending along a bottom surface of the gate region 120 from the well region. The shape of a channel region formed inside the semiconductor layer 100 may be varied depending on the shapes of the well region and the extension region 110a. The shape of the channel region is described in detail with reference to FIGS. 4A-4C.

The gate region 120 may be recessed by a second depth inside the semiconductor layer 100 to surround the well region.

The gate region 120 may include a conductor such as metal or silicon. The channel region may be formed inside the semiconductor layer 100 by a voltage applied to the gate region 120. According to an embodiment, the channel region may be formed in the well region and the extension region 110a and may be formed in the contact region between the well region and the extension region 110a, and the gate region 120.

The insulating layer 130 may electrically isolate the gate region 120 from another region (e.g., the well region 110) adjacent to the gate region 120. The insulating layer 130 may include, for example, silicon oxide, silicon carbide oxide, silicon nitride, hafnium oxide, zirconium oxide, or aluminum oxide, or a stacked structure thereof.

According to an embodiment, the thickness of the insulating layer 130 may be uniformly formed in all regions. According to another embodiment, the thickness of the insulating layer 130 adjacent to a lower portion of the gate region 120 may be greater than the thickness of the insulating layer 130 formed on a sidewall of the gate region 120, such that an electric field is reduced at the lower portion of the gate region 120. The sidewall of the gate region 120 may refer to a region, which makes contact with the well region 110, of the gate region 120.

The drift region 140 may be formed inside the semiconductor layer 100 to make contact with at least a portion of the gate region 120. The drift region 140 may include a protrusion region extending toward one surface of the semiconductor layer 100. The drift region 140 may make contact with a bottom surface of the gate region 120 and the protrusion region may make contact with side surfaces of the gate region 120 and the well region 110.

The drift region 140 may be a region doped with second conductive type impurities. According to an embodiment, the second conductive type refers to that a region is doped with N-type impurities.

The substrate region 150 may be formed under the drift region 140. The substrate region 150 may be doped with impurities in the same conductive type as the conductive type of the drift region 140. For example, when the drift region 140 is in the second conductive type, even the substrate region 150 may be doped with impurities in the second conductive type. Alternatively, the substrate region 150 may be doped with impurities at the higher concentration than the impurity concentration of the drift region 140.

Figure 2:
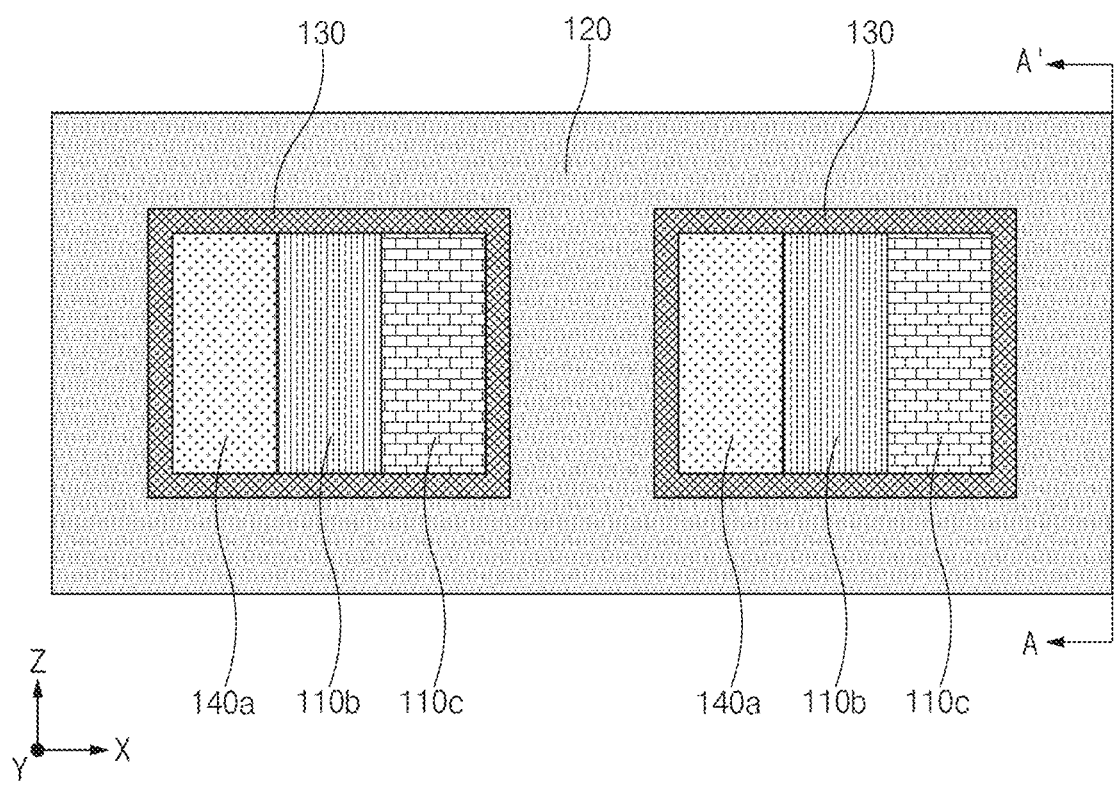
FIG. 2 illustrates a cross-sectional view taken along a first cutting line of a power semiconductor device, according to an embodiment of the present disclosure.

FIG. 2 illustrates a cross-sectional view 20 taken along first cutting line A-A' of a power semiconductor device 10, according to an embodiment of the present disclosure.

A cross-sectional view 20 of the power semiconductor device 10 may be viewed in a Y-axis direction (from a Z-X plane).

FIG. 2 illustrates a contact region 110b, a source region 110c, a gate region 120, an insulating layer 130, and a protrusion region 140a.

According to an embodiment of the present disclosure, the gate region 120 may be formed to surround a well region including the contact region 110b and the source region 110c.

According to an embodiment, the well region may have a rectangular sectional shape. The gate region 120 may make contact with the well region having a rectangular shape on at least three surfaces. The contact region 110b and a source region 110c may be formed at an upper portion the well region.

As the gate region 120 is formed to make contact with the well region on at least three surfaces, at least two channel regions may be formed when the power semiconductor device 10 operates.

The protrusion region 140a may be interposed between the gate region 120 and the well region. According to an embodiment, a channel region may be formed between the protrusion region 140a and the source region 110c.

The channel region between the protrusion region 140a and the source region 110c may be a horizontal channel. The length of the horizontal channel may be varied depending on the shape of the well region. According to an embodiment, the horizontal direction may refer to the direction parallel to the X-axis direction.

Figure 3:
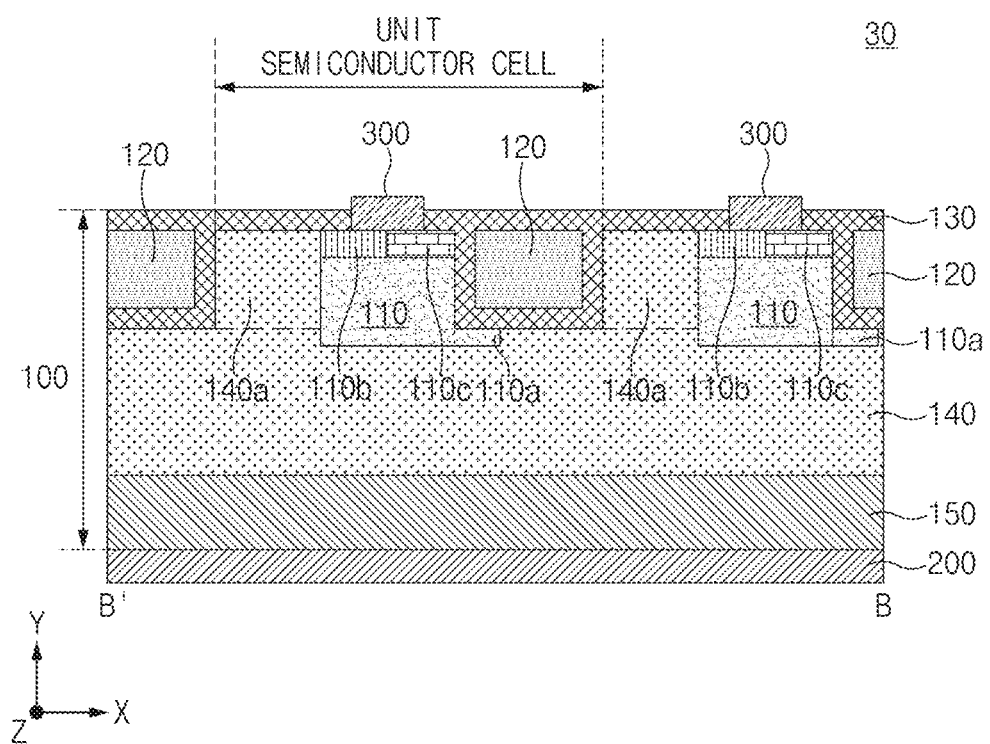
FIG. 3 illustrates a cross-sectional view taken along a second cutting line of a power semiconductor device, according to an embodiment of the present disclosure.

FIG. 3 illustrates a cross-sectional view 30 taken along second cutting line B-B' of the power semiconductor device 10, according to an embodiment of the present disclosure.

FIG. 3 illustrates the relationship in position among the semiconductor layer 100, the drain electrode 200, and the source electrode 300.

The cross-sectional view 30 of the power semiconductor device 10 illustrated in FIG. 3 may be a sectional view when viewed in the Z-axis direction (the X-Y plane).

The power semiconductor device 10 may include a plurality of unit semiconductor cells. The plurality of unit semiconductor cells may be repeatedly arranged in the direction parallel to the X axis.

The semiconductor layer 100 may include the well region 110, the gate region 120, the insulating layer 130, the drift region 140, and the substrate region 150, as described with reference to FIG. 1.

The well region 110 includes an extension region 110a extending in a horizontal direction (a direction parallel to the X-axis) along the bottom surface of the gate region 120, a contact region 110b formed on the well region 110 to make contact with the source electrode 300, and the source region 110c formed on the well region 110 to make contact with the source electrode 300.

The extension region 110a may have the first conductive type which is the same conductive type as the conductive type of the well region 110. As the extension region 110a is formed under the gate region 120, when a channel is formed by a voltage which is applied to the gate region 120, a channel extending in the horizontal direction (the direction parallel to the X axis) may be formed under the gate region 120.

The channel extending in the horizontal direction may be connected with a channel, which is formed to extend in a vertical direction (the direction parallel to the Y axis) along the side surface of the gate region 120 from the source region 110c.

The lower portion of the gate region 120 may be shielded with a conductive type, which is opposite to the conductive type of the drift region 140 (for example, the first conductive type), by the extension region 110a. The gate region 120 is shielded by the extension region 110a, thereby mitigating the reduction of the breakdown voltage due to the electric field concentrated at the lower end of the gate region 120.

When the operating voltage is not applied to the gate region 120, the electric field may be concentrated to the lower corner region of the gate region 120. The extension region 110a doped with the first conductive type impurities is formed in the lower corner, which has the concentration of the electric field, of the gate region 120, such that the electric field is scattered.

As the electric field is scattered by the extension region 110a, even if a higher voltage is applied to the drain electrode 200 when the power semiconductor device 10 is in a disable state (a switch-off state), damage to the power semiconductor device 10 may be prevented.

The contact region 110b may be doped with impurities in the same conductive type as that of the well region 110. According to an embodiment, the contact region 110b and the well region 110 may be doped with impurities in the first conductive type.

The doping concentration of the contact region 110b may be higher than the doping concentration of the well region 110. As the contact region 110b is doped at the higher concentration than the doping concentration of the well region 110, the contact resistance between the source electrode 300 and the contact region 110b may be reduced.

The source region 110c may be doped with impurities in a conductive type different from the conductive type of the well region 110. According to an embodiment, the source region 110c may be doped with impurities in the second conductive type. The source region 110c may be doped with impurities at a higher concentration than the concentration of the drift region 140.

The drift region 140 may include the protrusion region 140a interposed between the well region 110 and the gate region 120. According to an embodiment, the protrusion region 140a may be a region defined by the well region 110 and the gate region 120. The protrusion region 140a may be a region extending in the vertical direction (the direction parallel to the Y axis) toward one surface of the semiconductor layer 100 from the drift region 140.

When the power semiconductor device 10 is operated, an operating voltage may be applied to the gate region 120. When the operating voltage is applied, a channel region may be formed in the well region 110 adjacent to the gate region 120. Electrons of the source region 110c may move to the substrate region 150 via the drift region 140 through the channel region. The power semiconductor device 10 may control electron movement between the source electrode 300 and the drain electrode 200 by controlling the voltage applied to the gate region 120.

Electrons may move from the source region 110c to the protrusion region 140a through the channel region formed along the side surface of the well region 110. The channel region extending from the source region 110c to the protrusion region 140a may be configured to allow electrons to move in the horizontal direction (the direction parallel to the X axis).

In addition, the channel regions may be formed along the well region 110 and the extension region 110a in contact with the side surface and the bottom surface of the gate region 120.

The channel region formed along the extension region 110a and the well region 110, which is in contact with the side surface of the gate region 120, from the source region 110c may include a region to which electrons moves in the vertical direction (the direction parallel to the Y axis) and a region to which electrons moves in the horizontal direction (the direction parallel to the X-axis).

As the gate region 120 and the well region 110 make contact with at least three surfaces, at least three channel regions may be formed. As the three channels are formed in the vertical direction (the direction parallel to the Y axis) and the horizontal direction (direction parallel to the X axis), a channel density may be more increased, as compared to when only the channel extending in the vertical direction is formed.

A depth at which the well region 110 is formed in one surface of the semiconductor layer 100 may be referred to as a first depth. In addition, a depth at which the gate region 120 is formed in one surface of the semiconductor layer 100 may be referred to as a second depth.

The well region 110 may be formed inside the semiconductor layer 100, as the semiconductor layer 100 is doped with the first conductive type impurities by the first depth. The gate region 120 may be formed in a region formed by recessing the semiconductor layer 100 having the well region 110 by a second depth.

According to an embodiment, the first depth may be greater than the second depth. As the well region 110 is formed to have a depth greater than the depth of the gate region 120, a portion of the well region 110 may be formed to extend in the horizontal direction along the bottom surface of the gate region 120. The well region 110 extending along the bottom surface of the gate region 120 may be referred to as the extension region 110a.

Figure 4A:
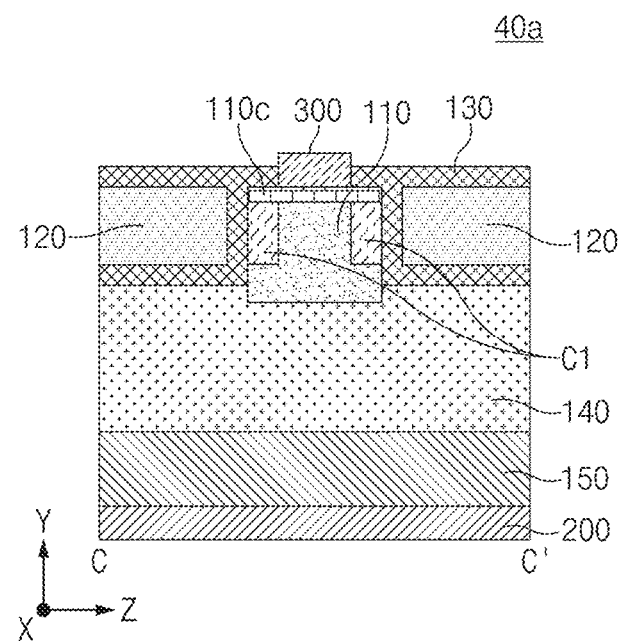
FIG. 4A illustrates a cross-sectional view taken along a third cutting line of a power semiconductor device, according to an embodiment of the present disclosure.

FIG. 4A illustrates a cross-sectional view 40a taken along third cutting line C-C' of the power semiconductor device 10, according to an embodiment of the present disclosure.

Figure 4B:
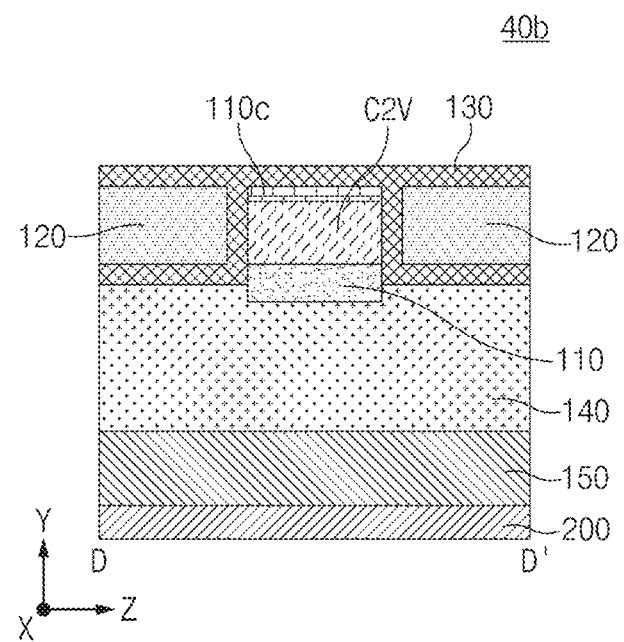
FIG. 4B illustrates a cross-sectional view taken along a fourth cutting line of a power semiconductor device, according to an embodiment of the present disclosure.

FIG. 4B illustrates a cross-sectional view 40b taken along fourth cutting line D-D' of the power semiconductor device 10, according to an embodiment of the present disclosure.

Figure 4C:
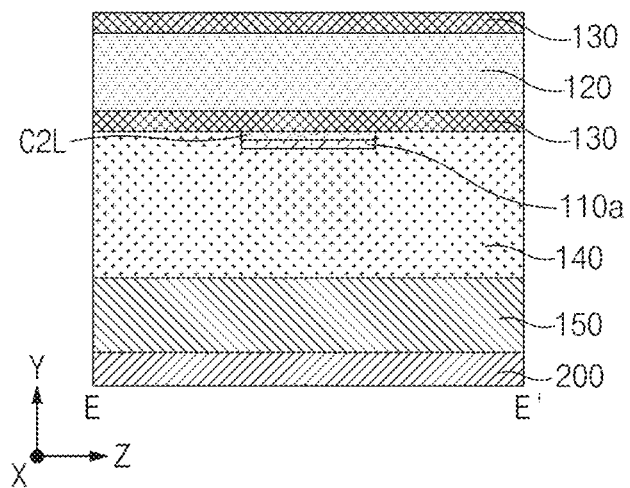
FIG. 4C illustrates a cross-sectional view taken along a fifth cutting line of a power semiconductor device, according to an embodiment of the present disclosure.

FIG. 4C illustrates a cross-sectional view 40c taken along fifth cutting line E-E' of the power semiconductor device 10, according to an embodiment of the present disclosure.

The following description is given in detail with reference to FIGS. 4A-4C, regarding the details of channel regions formed inside the power semiconductor device 10, when the operating voltage is applied to the gate region 120.

FIG. 4A illustrates the sectional view of a first channel region "C1" formed in the horizontal direction (the direction parallel to the X axis) along the side surface of the well region 110. The first channel region "C1" may include a horizontal channel (a channel extending in the direction parallel to the X axis) formed between the source region 110c and the protrusion region 140a.

The length of the first channel region "C1" in the X-axis direction may be determined depending on the shape of the well region 110. In addition, the length of the first channel region "C1" in the Y-axis direction may be determined depending on the depth (second depth) at which the gate region 120 is formed.

FIG. 4B illustrates a vertical channel "C2V" of a second channel region formed along another side surface of the well region 110. The vertical channel "C2V" of the second channel region may be formed between the source region 110c and the bottom surface of the well region 110. The vertical channel "C2V" of the second channel region may be formed to extend along the side surface of the gate region 120.

According to an embodiment, the length of the vertical channel "C2V", which is included in the second channel region, in the vertical direction (the direction parallel to the Y-axis) may be determined depending on the length of the gate region 120 in the vertical direction (the direction parallel to the Y-axis).

FIG. 4C illustrates a cross-sectional view of a horizontal channel "C2L" included in the second channel region.

The horizontal channel "C2L" of the second channel region may be a channel extending in the horizontal direction (the direction parallel to the X-axis) along the bottom surface of the gate region 120.

According to an embodiment, the length of the horizontal channel "C2L", which is included in the second channel region, in the horizontal direction (the direction parallel to the X-axis) may be determined depending on the length of the extension region 110a in the horizontal direction (the direction parallel to the X-axis).

According to an embodiment of the present disclosure, in the power semiconductor device 10, the gate region 120 may make contact with the well region on at least three surfaces. The first channel region "C1" and the second channel regions "C2V" and "C2L" are formed in the contact regions between the gate region 120 and the well region. Electron movement is thereby facilitated when the operating voltage is applied to the gate region 120.

In particular, according to the present disclosure, the power semiconductor device 10 may further include the first channel region "C1", when compared to a trench-type gate structure including only the vertical channel. Accordingly, electrons are distributed to the first channel region "C1", such that the resistance of the whole channel region may be reduced.

The horizontal channel "C2L" included in the second channel region operates as a channel for electron movement such that the electrons smoothly move when the operating voltage is applied to the gate region 120. When the operating voltage is not applied, the horizontal channel "C2L" may distribute an electric field, which is concentrated at the lower portion of the gate region 120. The breakdown voltage of the power semiconductor device 10 is thereby enhanced.

Figure 5:
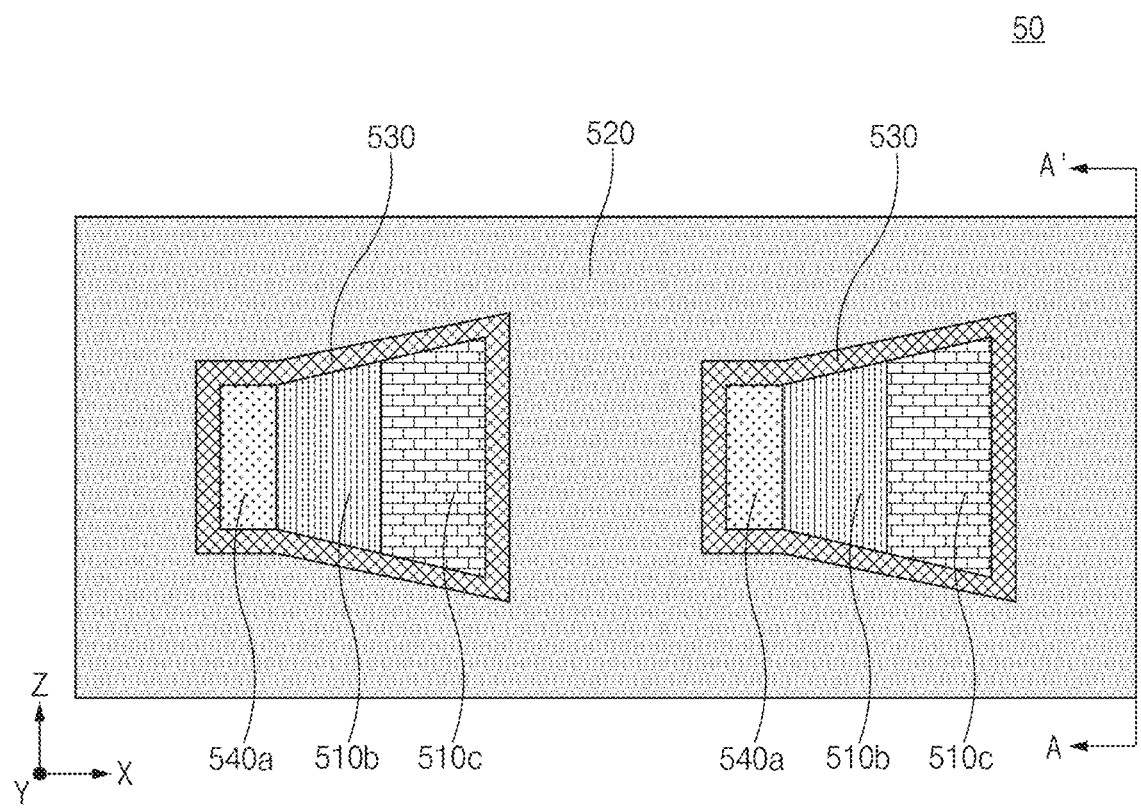
FIG. 5 illustrates a cross-sectional view taken along a first cutting line of a power semiconductor device, according to another embodiment of the present disclosure.

FIG. 5 illustrates a cross-sectional view 50 taken along first cutting line A-A' of a power semiconductor device, according to another embodiment of the present disclosure.

According to another embodiment of the present disclosure, the cross-sectional view 50 is viewed in the Y-axis direction (Z-X plane).

FIG. 5 illustrates a contact region 510b, a source region 510c, a gate region 520, an insulating layer 530, and a protrusion region 540a.

According to another embodiment of the present disclosure, the gate region 520 may be formed to surround a well region.

According to another embodiment, the well region may have a trapezoidal sectional shape. The gate region 520 may make contact with the well region having a trapezoidal shape on at least three surfaces.

According to another embodiment, the shapes of the contact region 510b and the source region 510c may be determined depending on the shape of the well region.

As the gate region 520 is formed to make contact with the well region on at least three surfaces, at least two channel regions may be formed when the power semiconductor device 10 operates.

The protrusion region 540a may be interposed between the gate region 520 and the well region. According to an embodiment, a channel region may be formed between the protrusion region 540a and the source region 510c.

The channel region between the protrusion region 540a and the source region 510c may be a first channel region. The length of the first channel region may be varied depending on the shape of the well region.

According to another embodiment of the present disclosure, when the well regions have equal lengths in the horizontal direction (the direction parallel to the X-axis), the length of the first channel region formed in the trapezoidal well region may be longer than the length of the first channel region formed in the rectangular well region (for example, the well region of FIG. 2). The movement of charges between the source electrode and the drain electrode is adjusted by adjusting the length of the first channel region, thereby adjusting the current density inside the power semiconductor device 10.

Figure 6:
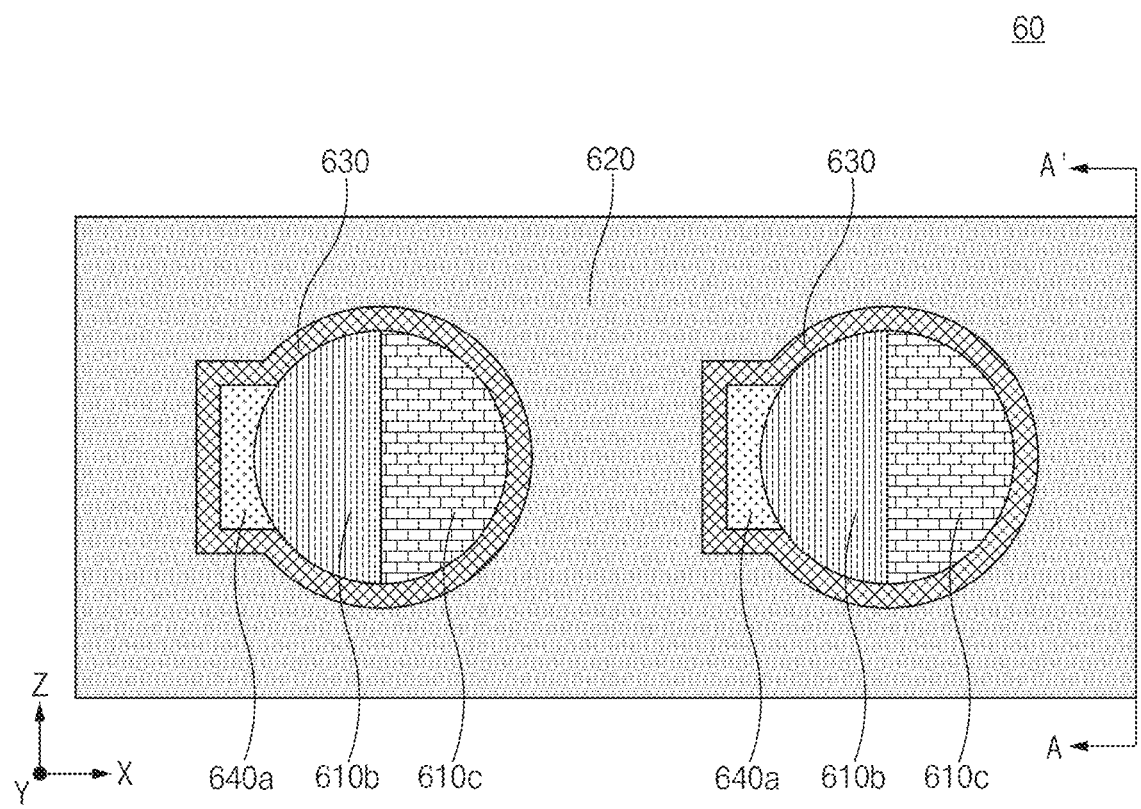
FIG. 6 illustrates a cross-sectional view taken along a first cutting line of a power semiconductor device, according to still another embodiment of the present disclosure.

FIG. 6 illustrates a cross-sectional view 60 taken along first cutting line A-A' of a power semiconductor device, according to another embodiment of the present disclosure.

According to another embodiment of the present disclosure, a gate region 620 may be formed to surround a well region including a contact region 610b and a source region 610c.

According to another embodiment, the well region may have a circular cross-sectional shape. The gate region 620 may be formed to surround the well region having the circular shape.

The shapes of the contact region 610b and the source region 610c may be determined depending on the shape of the well region.

According to an embodiment, a channel region may be formed between the protrusion region 640a and the source region 610c.

According to another embodiment of the present disclosure, when the well regions have equal lengths in the horizontal direction (the direction parallel to the X-axis), the length of the first channel region formed on a side surface of the circular well region may be longer than the length of the first channel region formed in the rectangular well region (for example, the well region of FIG. 2).

When the length of the first channel region is increased, the channel resistance may be increased, as compared to that of the length of the shorter first channel region. When the resistance of the first channel region is increased, electrons moving to the first channel region may be decreased, and electrons moving to the second channel region may be increased.

According to an embodiment of the present disclosure, the power semiconductor device may control an amount (i.e., quantity) of electrons moving to the first channel region or the second channel region by adjusting the length of the channel region depending on the shape of the sectional-surface of the well region.

FIGS. 7A-7F are views illustrating a method for fabricating a power semiconductor device, according to an embodiment of the present disclosure.

Figure 7A:
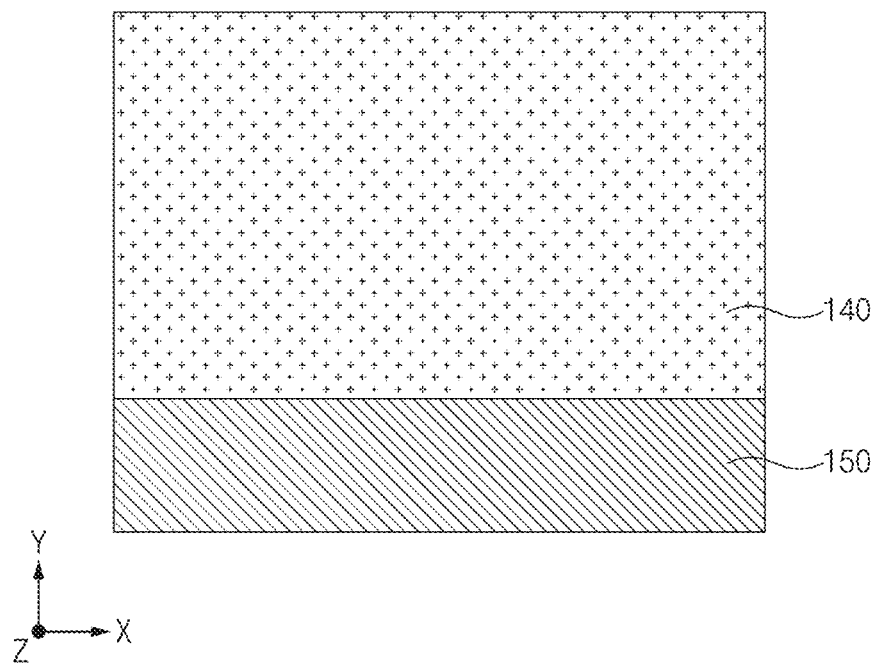
FIGS. 7A-7F are views illustrating a method for fabricating a power semiconductor device, according to an embodiment of the present disclosure.

Referring to FIG. 7A, the drift region 140 may be formed on the substrate region 150. The substrate region 150 may include a silicon carbide (SiC) substrate doped with second conductive type impurities.

The drift region 140 may be an epitaxial layer by way of example. The drift region 140 may be doped with the second conductive type impurities at a doping concentration lower than a doping concentration of the substrate region 150.

Figure 7B:
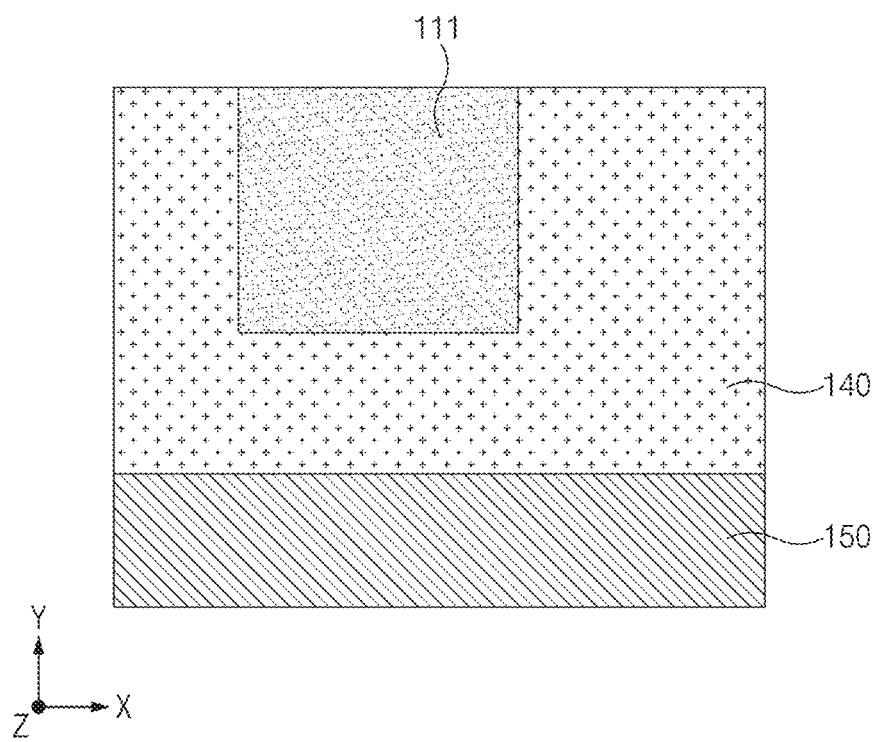

FIG. 7B is a view illustrating the procedure of forming a well doping region 111 formed by doping first conductive type impurities into the drift region 140. The depth at which the well region 110 is formed may be determined depending on the depth in which the well doping region 111 is formed.

The length of the first channel region, which is formed along the side surface of the well region 110, may be determined depending on the length of the well doping region 111 in the X-axis direction.

The well doping region 111 may be formed, for example, through an ion implant process.

Figure 7C:
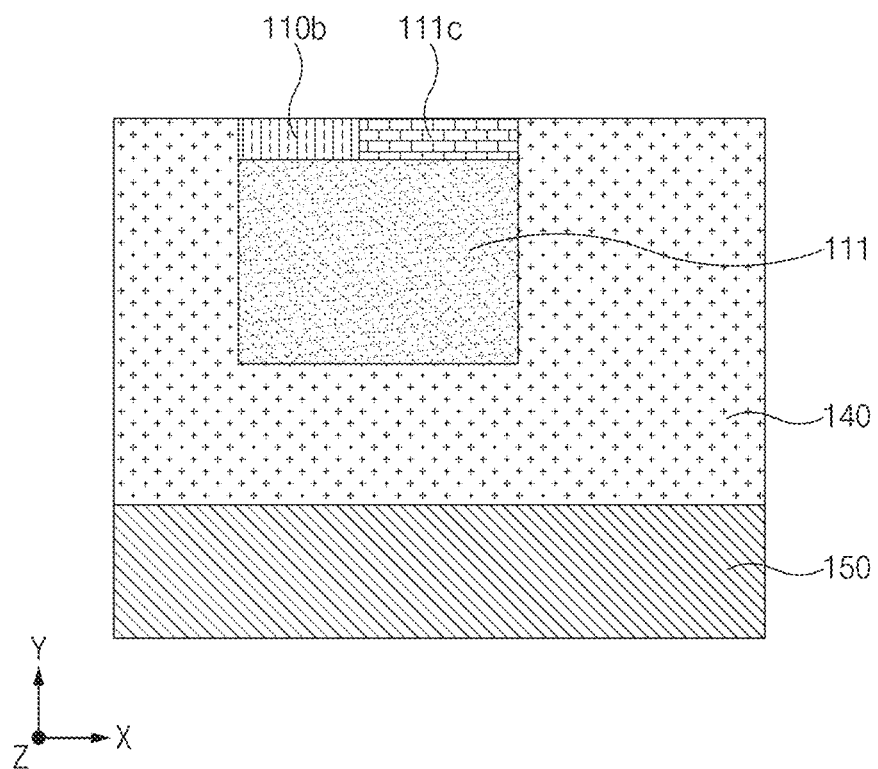

FIG. 7C illustrates the procedure of forming, the contact region 110b and a source doping region 111c on the well doping region 111. The contact region 110b may be doped with impurities in the same conductive type as the conductive type of the well doping region 111. The contact region 110b may be doped with impurities at a concentration higher than the concentration of the well doping region 111.

The source doping region 111c may be doped with impurities in the conductive type different from the conductive type of the well doping region 111.

Each of the contact region 110b and the source doping region 111c may be formed through the ion implant process.

Figure 7D:
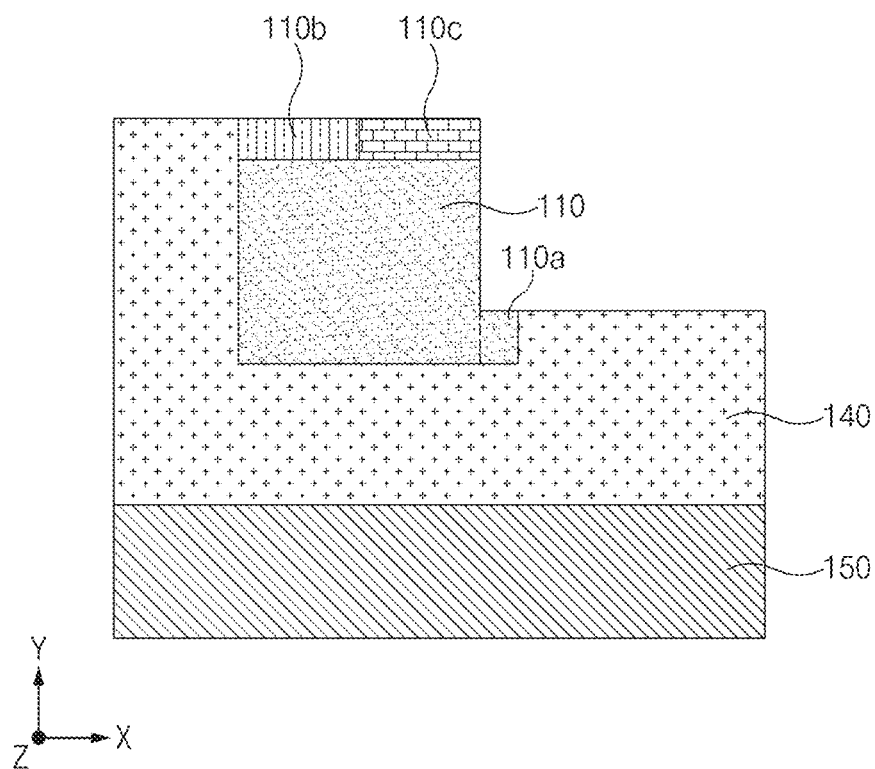
Figure 7E:
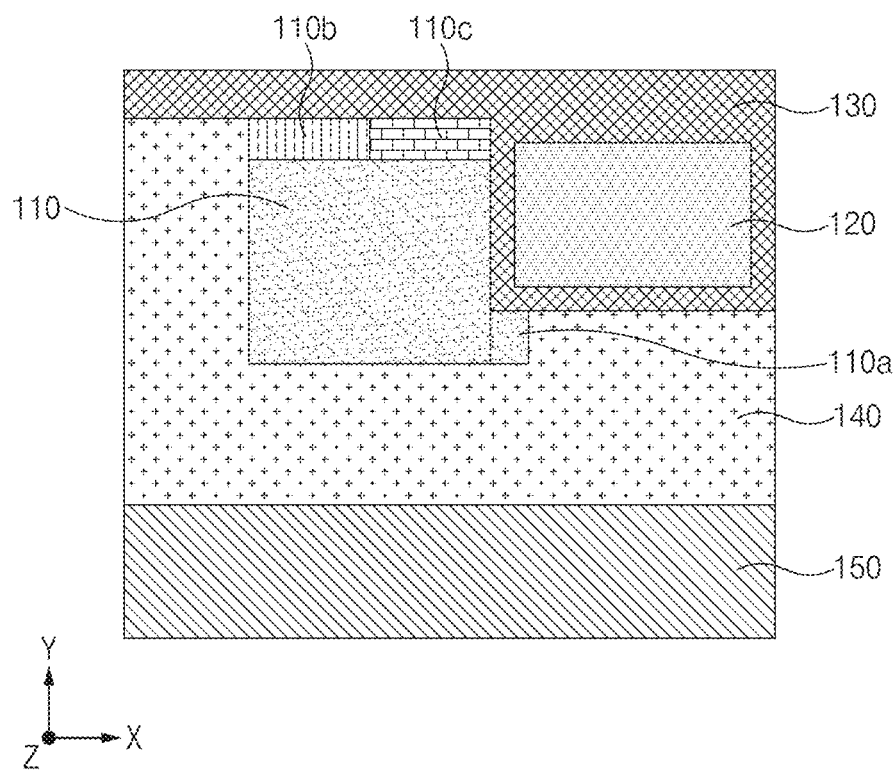

FIGS. 7D and 7E illustrate the procedure of forming the insulating layer 130 and the gate region 120 by partially etching the drift region 140, the well doping region 111, and the source doping region 111c.

The drift region 140, the well doping region 111, and the source doping region 111c may be etched through an etching process. The length for forming the gate region 120 may be determined based on the etching depth of the drift region 140, the well doping region 111, and the source doping region 111c.

After the etching process, the insulating layer 130 and the gate region 120 may be formed through a deposition process. The insulating layer 130 may include, for example, a silicon oxide layer.

Figure 7F:
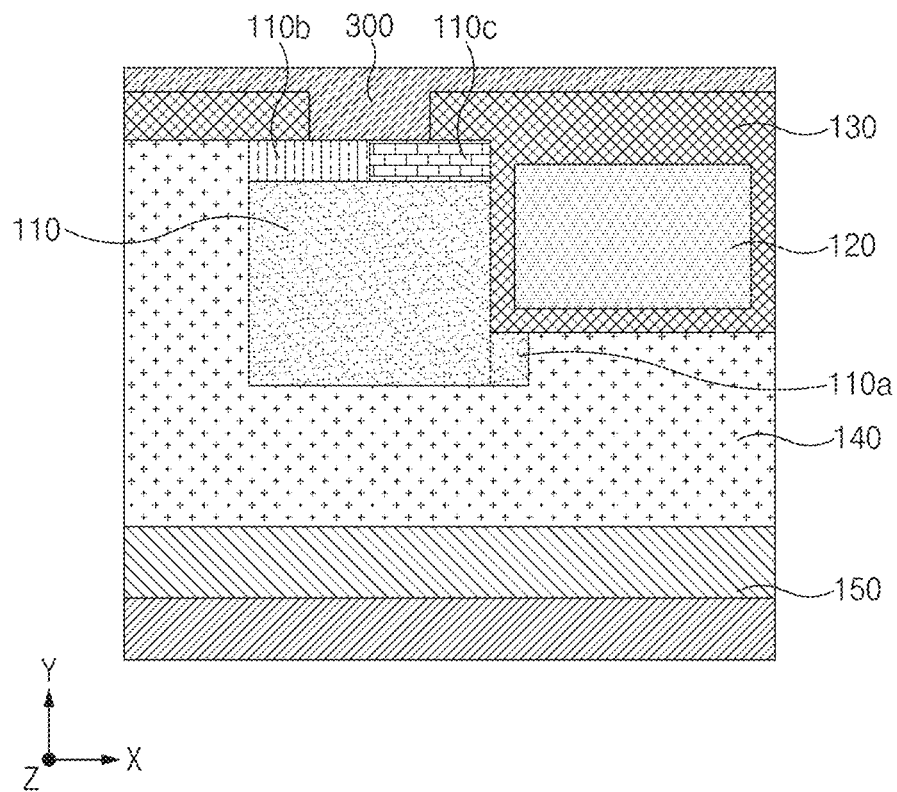

FIG. 7F illustrates the procedure of forming the source electrode 300 and the drain electrode 200.

The source electrode 300 and the drain electrode 200 may include a conductive material, such as metal or silicon, and the source electrode 300 and the drain electrode 200 may be formed through a deposition process.

According to an embodiment of the present disclosure, in the power semiconductor device and the method for fabricating the same, the concentration of the electric field may be mitigated at the lower portion of the gate region, and the breakdown voltage of the power semiconductor device may be increased.

In addition, the channel density formed in the power semiconductor device may be increased, thereby increasing the degree of integration and reducing power loss.

A variety of effects directly or indirectly understood through the disclosure may be provided.

Although embodiments of the present disclosure have been described with reference to accompanying drawings, those having ordinary skill in the art should understand that various modifications are possible without departing from the technical scope of the present disclosure or without changing the subject matter of the present disclosure. Therefore, those having ordinary skill in the art should understand that the technical embodiments are provided for the illustrative purpose in all aspects and the present disclosure is not limited thereto.

Hereinabove, although the present disclosure has been described with reference to embodiments and the accompanying drawings, the present disclosure is not limited thereto. The embodiments may be variously modified and altered by those having ordinary skill in the art to which the present disclosure pertains without departing from the spirit and scope of the present disclosure claimed in the following claims.

What is claimed is:

1. A power semiconductor device comprising:
a semiconductor layer;
a well region positioned inside the semiconductor layer and having a first conductive type;
a source region positioned on the well region and having a second conductive type;
a gate region making contact with a side surface of the well region to surround the well region; and
a drift region making contact with bottom surfaces of the well region and the gate region and having the second conductive type,
wherein the drift region includes a protrusion region extending from the drift region and making contact with another side surface of the well region, and
wherein the gate region makes contact with the well region on at least three surfaces.

2. The power semiconductor device of claim 1, further comprising:
a first channel region and a second channel region positioned in contact regions between the gate region and the well region,
wherein the first channel region includes a horizontal channel extending from the source region toward the protrusion region, and
wherein the second channel region includes a vertical channel extending a side surface of the gate region from the source region.

3. The power semiconductor device of claim 1, wherein a doping concentration of the source region is higher than a doping concentration of the drift region.

4. The power semiconductor device of claim 1, further comprising:
a contact region positioned on the well region and having the first conductive type,
wherein a doping concentration of the contact region is higher than a doping concentration of the well region.

5. The power semiconductor device of claim 1, further comprising:
a contact region positioned on the well region and having the first conductive type; and
a source electrode making contact with the source region and the contact region.

6. The power semiconductor device of claim 1, further comprising:
a substrate region positioned under the drift region and having the second conductive type; and
a drain electrode positioned under the substrate region and making contact with the substrate region,
wherein a doping concentration of the substrate region be higher than a doping concentration of the drift region.

7. The power semiconductor device of claim 1, wherein the well region has a circular sectional surface.

8. The power semiconductor device of claim 1, wherein the well region has a polygonal sectional surface having at least three sides.

9. The power semiconductor device of claim 1, wherein the well region is positioned at a first depth from one surface of the semiconductor layer,
wherein the gate region is positioned at a second depth from the one surface of the semiconductor layer,
wherein the first depth is greater than the second depth, and
wherein the well region includes an extension region extending along a bottom surface of the gate region.

10. A method for fabricating a power semiconductor device, the method comprising:

forming a drift region of a second conductive type on a semiconductor layer;

forming a well region of a first conductive type at a first depth from one surface of the semiconductor layer;

forming a source region of the second conductive type on the well region;

forming a contact region of the first conductive type on the well region; and forming a gate region by recessing the semiconductor layer and the well region by a second depth to make contact with a side surface of the well region and to surround the well region, wherein the drift region includes a protrusion region extending from the drift region and making contact with another side surface of the well region, and wherein the gate region is formed to make contact with the well region on at least three surfaces.

11. The method of claim 10, wherein the first depth is greater than the second depth.

12. The method of claim 10, wherein the contact region is doped at a doping concentration higher than a doping concentration of the well region.

13. The method of claim 10, wherein the source region is doped at a doping concentration higher than a doping concentration of the drift region.

14. The method of claim 10, further comprising:

forming a first channel region and a second channel region in contact regions between the gate region and the well region, wherein the first channel region includes a horizontal channel extending from the source region toward the protrusion region, and wherein the second channel region includes a vertical channel extending along a side surface of the gate region from the source region.

15. The method of claim 10, further comprising:

forming a source electrode making contact with the source region and the contact region.

16. A power semiconductor device comprising:

a semiconductor layer;

a well region positioned inside the semiconductor layer and having a first conductive type;

a source region positioned on the well region and having a second conductive type;

a gate region making contact with a side surface of the well region to surround the well region; and a drift region making contact with bottom surfaces of the well region and the gate region and having the second conductive type, wherein the drift region includes a protrusion region extending from the drift region and making contact with another side surface of the well region, and wherein the well region has a circular sectional surface or has a polygonal sectional surface having at least three sides.

* * * * *